(12) United States Patent
Hickernell

(10) Patent No.: US 6,172,582 B1
(45) Date of Patent: Jan. 9, 2001

(54) SAW RESONATOR AND LADDER FILTER WITH SPECIFIED NUMBER OF REFLECTOR ELECTRODE FINGERS

(75) Inventor: Thomas Slocum Hickernell, Mesa, AZ (US)

(73) Assignee: CTS Corporation, Elkhart, IN (US)

( * ) Notice: Under 35 U.S.C. 154(b), the term of this patent shall be extended for 404 days.

(21) Appl. No.: 08/603,523

(22) Filed: Feb. 20, 1996

(51) Int. Cl.⁷ .................................................. H03H 9/64
(52) U.S. Cl. ...................................... 333/195; 310/313 D
(58) Field of Search .................................. 333/193–196, 333/150, 134; 310/313 R, 313 B, 313 D

(56) References Cited

U.S. PATENT DOCUMENTS

| | | | |
|---|---|---|---|
| 4,048,594 | * 9/1977 | Weglein | 333/195 |
| 4,130,813 | 12/1978 | Sandy et al. | 333/72 |
| 4,144,507 | 3/1979 | Shreve | 333/191 |
| 4,410,823 | 10/1983 | Miller et al. | 310/313 D |
| 4,454,488 | * 6/1984 | Hartman | 333/195 |
| 4,542,356 | 9/1985 | Nakazawa et al. | 333/195 |
| 4,575,698 | 3/1986 | Schofield | 333/195 |
| 4,625,208 | 11/1986 | Skeie et al. | 342/51 |
| 4,642,506 | 2/1987 | Lewis | 310/313 D |
| 4,683,394 | 7/1987 | Koshino | 310/313 R |
| 4,760,359 | 7/1988 | Shiba et al. | 333/194 |
| 5,010,269 | 4/1991 | Hikita t al. | 310/313 B |
| 5,223,762 | 6/1993 | Masaie et al. | 310/313 D |
| 5,274,345 | 12/1993 | Gau | 333/153 |
| 5,471,178 | * 11/1995 | Hickernell | 333/195 |
| 5,543,757 | * 8/1996 | Kobayashi et al. | 333/195 |
| 5,559,481 | * 9/1996 | Satoh et al. | 333/193 |

FOREIGN PATENT DOCUMENTS

| | | |
|---|---|---|
| 0481733A1 | 4/1992 | (EP) . |
| 03085807 | 4/1991 | (JP) . |
| 3-261210 | * 11/1991 | (JP) ............ 333/195 |

* cited by examiner

*Primary Examiner*—Robert Pascal
*Assistant Examiner*—Barbara Summons
(74) *Attorney, Agent, or Firm*—Frederick M. Fliegel; Brian M. Mancini

(57) ABSTRACT

A method and apparatus for a ladder filter (400) incorporating same. The filter (400) includes a substrate and a first series resonator (100, 403) disposed on the substrate and electrically coupled in series between the first electrical port (401) and a first node. The first series resonator (100, 403) includes a first series acoustic reflector (115), a first series gap (112), a first series transducer (105, 403), a second series gap (112) and a second series acoustic reflector (115') collectively disposed in an in-line configuration along a principal axis of the substrate. The filter (400) also includes a first shunt resonator (100, 404) disposed on the substrate and electrically coupled in shunt between the first node and ground. The first shunt transducer (105, 404) and the first series transducer (105, 403), if reflectors (115, 115') are included, have an optimized number of reflective elements (116, 116') included therein.

4 Claims, 4 Drawing Sheets

US 6,172,582 B1

SAW RESONATOR AND LADDER FILTER WITH SPECIFIED NUMBER OF REFLECTOR ELECTRODE FINGERS

FIELD OF THE INVENTION

The present invention relates in general to surface acoustic wave filters, in particular to leaky surface wave/surface skimming bulk wave filters and more particularly to acoustic filters fabricated on high electromechanical coupling coefficient substrata.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or equipment information sharing requirements. The desire to render increasingly complicated communications nodes portable and even hand-held and/or portable and/or pocket-sized places extreme demands on filtering technology in the context of increasingly crowded radio frequency resources.

Acoustic wave devices provide filters meeting stringent performance requirements, which filters are (i) extremely robust, (ii) readily mass produced, (iii) adjustment-free over the life of the unit and (iv) which sharply increase the performance-to-size ratio achievable in the frequency range extending from a few tens of megahertz to about several gigahertz. However, need for low passband insertion loss simultaneously coupled with demand for high shape factor and high stopband attenuation pose filter design and performance requirements not easily met by a single acoustic wave filter alone.

One approach to satisfying these needs and demands is to cascade two or more acoustic wave filters. This approach realizes increased stopband signal rejection but requires additional matching components (e.g., inductors and/or capacitors) and also multiplies the volume and weight of the acoustic wave filters by the number of such filters cascaded, when each filter is separately realized, impedance matched and packaged. Matching components additionally incur major size and weight penalties because each transducer generally requires at least two matching components, each of which is at least as large as an acoustic wave filter die.

Another approach is to provide two or more such filters on a single substrate, wherein the filters are designed to have purely real impedances matched one to another without requiring intervening matching components. One realization includes a series-parallel arrangement of resonant elements having staggered center frequencies and arranged in a ladder structure, i.e., a structure known as a "ladder filter" and comprising cascaded sections, each including a series resonant element followed by a shunt resonant element. Typically, within each section, the antiresonant frequency of the shunt element is chosen to be equal to the resonant frequency of the accompanying series element. Disadvantages of this approach when implemented employing SAW resonators include a fixed bandwidth for the electromechanical coupling coefficient ($k^2$) associated with the chosen substrate material. Generally, conventional design approaches are such that when three of the filter material, impedance, selectivity and bandwidth characteristics are specified, the fourth is also determined.

Acoustic wave filters including ladder filters formed from groupings of resonators employ generally periodic arrays of electrodes configured to provide discrete elements such as transducers (for converting electrical to mechanical energy and vice versa), reflectors (for reversing the direction of propagation of an acoustic wave) and gaps for separating transducers and reflectors. These elements are grouped in a generally in-line configuration (e.g., reflector, gap, transducer, gap, reflector) along a principal axis of acoustic wave propagation on a suitable substrate material, with the entire array providing an electrical filtering function associated with the electrical port(s) of the individual transducer (s) and/or the composite filter.

Typically, acoustic reflectors provide reduced insertion loss by trapping energy within a Fabry-Perot-like cavity formed about a transducer. Conventional acoustic reflectors include large numbers of reflection elements in order to increase the efficiency of the energy-trapping. This increases the physical size ("footprint") of the device and also reduces the bandwidth over which the reflector operates efficiently. Additionally this may result in increased ripple in the filter "skirt" regions, where the response is rapidly changing from low to high insertion loss (or vice versa) with frequency.

What is needed is a ladder filter configuration/design methodology providing flexible bandwidth, suitable out-of-band rejection and low in-band insertion loss, drift-free performance and realizable in compact, robust and desirably in monolithic form.

BRIEF DESCRIPTION ON THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

Figure 1:
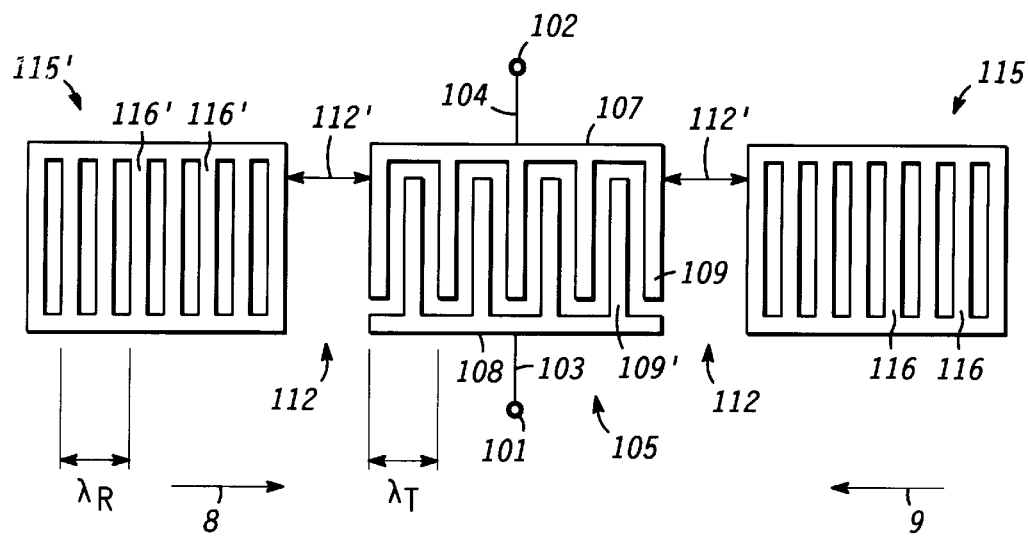
FIG. 1 is a plan view of an acoustic wave resonator in accordance with the present invention.

Generally, the present invention provides a method and apparatus for improving tradeoffs between insertion loss and bandwidth of SAW (e.g., SAW, surface skimming bulk wave, leaky wave etc.) ladder-type filters or other acoustic wave devices fabricated on high electromechanical coupling coefficient substrata. The present invention may be more fully understood with reference to FIG. 1, which provides a simplified plan view of acoustic wave resonator 100 in accordance with the present invention. FIG. 1 illustrates acoustic wave resonator 100 comprising reflectors 115, 115' disposed at acoustic ports of transducer 105, one or more transducers 105 separated from reflectors 115, 115' by gaps 112, all collectively disposed in an in-line configuration along a preferred axis (e.g., as indicated by direction arrows 8, 9) of the substrate material and on a suitably-prepared surface thereof. It will be appreciated that reflective elements 116, 116' may be electrically coupled together (if conductive) as illustrated or may be electrically isolated from one another or that reflectors 115, 115' may comprise a mixture of conductive or nonconductive features or may include recesses or grooves. Reflective elements 116, 116' are conveniently realized as metallized features formed at the same time as, and of the same material as, transducer 105.

Electrical stimulation at an appropriate frequency supplied from electrical ports 101, 102 to bus bars 108, 107 via interconnections 103, 104 and thence to interdigitated or interleaved electrodes 109', 109 results in acoustic waves being generated within transducer 105. Similarly, acoustic waves of an appropriate frequency impinging upon electrodes 109', 109 result in electrical signals being manifested at interconnections 101, 102. As used herein, the term "acoustic wavelength" is taken to mean an acoustic wavelength at the filter center frequency, i.e., in the nominal center of the filter passband.

Each transducer 105 comprises a series of periodically disposed electrodes 109, 109', often one-fourth of an acoustic wavelength in width, disposed on one-half acoustic wavelength centers, usually alternately coupled to their associated bus bars 107, 108, respectively, although other arrangements are possible and useful.

Gaps 112 have gap breadth 112' chosen in accordance with design principles applicable to acoustic wave filters and the specifications relevant to the filter being designed. Gap breadths 112' influence passband characteristics such as bandwidth and passband ripple. Reflectors 115, 115' have a characteristic periodicity and therefore a characteristic wavelength $\lambda_R$ while transducer 105 also has a characteristic periodicity and therefore a characteristic wavelength $\lambda_T$. Typically, both transducer 105 and reflectors 115, 115' comprises electrodes or fingers 109, 109' or 116, 116' one-fourth of a wavelength broad (as illustrated), providing two of electrodes 109, 109' or 116, 116' and two intervening gaps per wavelength, however, it will be appreciated that other arrangements are possible and in some applications are preferred.

Resonator 100 may be constructed on suitably-prepared substrata capable of supporting acoustic wave propagation such as lithium tetraborate, 41° rotated, Y-cut, X-propagating LiNbO$_3$ (lithium niobate), 64° rotated, Y-cut, X-propagating LiNbO$_3$ and 36° rotated, Y-cut, X-propagating LiTaO$_3$ (lithium tantalate). Resonator 100 is typically fabricated by depositing and patterning a thin metal film, often comprising aluminum, in a thickness ranging from tens to hundreds of nanometers thick, by techniques similar to those employed in integrated circuit manufacturing, but are in some ways much more challenging to fabricate and much less forgiving of design rule variations and/or defects.

The present invention is especially useful when low insertion loss is required together with wide passband width, for which higher electromechanical coupling coefficient substrata are particularly well suited. Typically, the designer of such a filter chooses gap widths (e.g., 112') for gaps (e.g., 112) disposed between the transducer (e.g., 105) and the reflectors (e.g., 115, 115') to provide an approximation to a combination of passband insertion loss, out-of-band rejection characteristics and bandwidth and then adjusts width(s) 112' of gap(s) 112 disposed between transducer 105 and reflectors 115, 115' to realize optimum bandwidth, insertion loss and other filter characteristics.

Resonator 100 is conveniently modeled as a series RLC circuit (e.g., a resistor of resistance R having one lead coupled to terminal 101, in series with an inductor having inductance L, in turn coupled in series with a capacitor having capacitance Cm and having a second lead coupled to terminal 102) bridged by a capacitor having capacitance C$_o$ (i.e., coupled from terminal 101 to terminal 102). Values for components C$_o$, C$_m$, L, R are found from Eqs. 1–3 (infra), the geometry of transducer 105 and relevant material constants. R may be usefully estimated as zero (i.e., ignored) or may be modeled from empirical data. Values of a few Ohms are often encountered in practice. R represents bulk wave radiation, acoustic propagation away from the receiving transducer, metal resistivity, diffraction effects and other losses encountered in acoustic resonant elements. Static capacitance C$_o$ is found from:

$$C_o = C_e NW, \quad (1)$$

where C$_e$ is a material parameter describing capacitance per finger pair per cm (tabulated for many materials in a variety of textbooks), N represents the number of transducer finger pairs (e.g., pairs of electrodes 109, 109' in transducer 105) and W represents the overlap of electrodes 109, 109' or beamwidth in cm.

Motional capacitance C$_m$ is related to static capacitance C$_o$:

$$C_m = (8k^2 C_o)/(\pi^2), \quad (2)$$

where k$^2$ represents the electromechanical coupling coefficient (tabulated in a variety of textbooks related to piezoelectric materials). Motional inductance L is given by:

$$L = 1/(C_m \omega_r^2), \quad (3)$$

where $\omega_r$ represents the radian transducer resonant frequency.

Admittance Y measured between terminals 101, 102 is:

$$Y = j\omega C_o + 1/(R + j(\omega L - 1/(\omega C_m))) \quad (4)$$

Admittance Y has resonant frequency $\omega_r$, usually close to and slightly lower than the acoustic center frequency (approximately the sound velocity divided by the acoustic wavelength $\lambda_T$ associated with the periodicity of electrodes 109, 109' of transducer 105):

$$\omega_r (LC_m)^{-0.5}, \quad (5)$$

and antiresonant frequency $\omega_a$:

$$\omega_a = \omega_r (1 + C_m/C_o)^{0.5}, \quad (6)$$

or $$\omega_a = \omega_r (1 + 8k^2/\pi^2)^{0.5}. \quad (7)$$

For a given transducer 105, antiresonant frequency $\omega_a$ is always greater than resonant frequency $\omega_r$ by a ratio determined by electromechanical coupling coefficient $k^2$ (Eq. 7). For extremely high coupling coefficients (e.g., $k^2>5\%$), an appropriate coupling coefficient value may need to be empirically determined because the assumptions employed in relating physical parameters (e.g., acoustic wavelength, radiation conductance, $\omega_a$, $\omega_r$, etc.) to each other and to acoustic center frequencies are not entirely valid. In accordance with the present invention, coupling coefficients are generally usefully greater than 0.0001, more usefully greater than 0.01, generally desirably greater than 0.05, more desirably greater than 0.07 and preferably greater than 0.10.

Ladder filters typically employ elements wherein the resonant frequencies of the series elements are chosen to be equal to the antiresonant frequencies of the shunt elements. In traditional narrow-band crystal lattice filters employing quartz resonant elements, electromechanical coupling coefficient $k^2$ is typically much smaller than 0.5%, limiting the fractional bandwidth (bandwidth divided by center frequency) achievable for such filters to very small values.

Applicants have discovered that use of much higher coupling coefficient materials (e.g., $LiNbO_3$, $LiTaO_3$, lithium tetraborate etc.) provides much greater spread between resonant and antiresonant frequencies. For example, 64° $LiNbO_3$ provides a coupling coefficient in the range of from 9% to 13% (nominally about 10.5%), 41° $LiNbO_3$ provides coupling coefficients in the range from 15–25% (nominally about 17%) and 36° $LiTaO_3$ provides coupling coefficients in the range from 6.5–8% (nominally about 7.5%). This increased frequency spread in turn allows greater design freedom.

Figure 2:
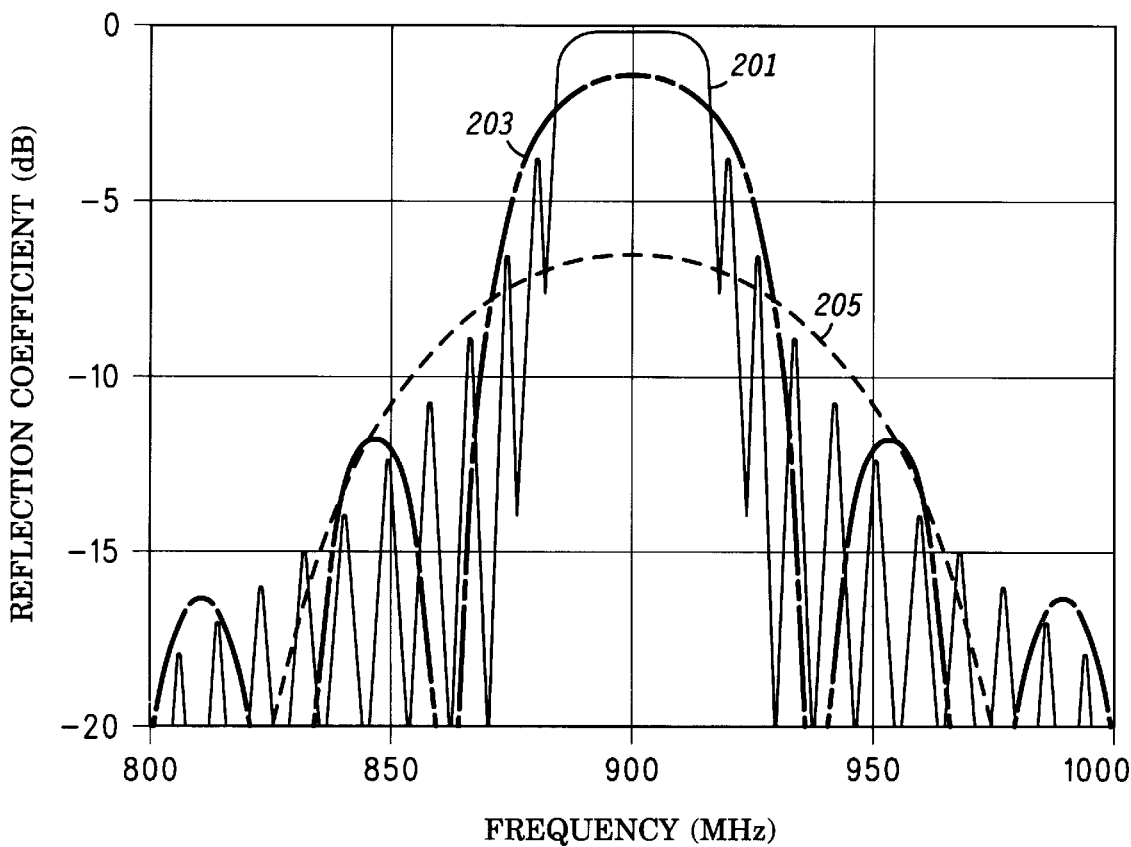
FIG. 2 is a graph of frequency responses for several different acoustic reflectors.

Applicants have also discovered that most of the reflectivity of acoustic reflectors such as 115, 115' results from the portion of the reflector closest to transducer 105 while most of the band-limiting effects of reflectors 115, 115' result from the entire ensemble of reflection elements 116, 116'. This effect is illustrated in FIG. 2, which is a graph of frequency responses for several different acoustic reflectors. Trace 201 corresponds to a reflector 115, 115' including 100 reflective elements 116, 116'; trace 203 corresponds to a reflector 115, 115' including 25 reflective elements 116, 116' and trace 205 corresponds to a reflector 115, 115' including only ten reflective elements 116, 116'.

On high coupling coefficient substrata, electrical boundary condition effects contribute to the majority of the reflections engendered by reflection elements 116, 116', allowing the length of reflectors 115, 115' to be greatly reduced in comparison to prior art reflectors without significant sacrifice of filter insertion loss. This also results in improved filter skirt characteristics because ripples associated with the reflector frequency response (see the outer portions of trace 201 within the central lobe of trace 203) are not coincident with the desired passband or transition band regions.

In accordance with the present invention, series and shunt elements' resonant $\omega_r$ and antiresonant $\omega_a$ frequencies are usefully determined via circuit optimization tools such as SuperCompact®, available from Compact Software of Paterson NJ. One method is to input a series of resonant $\omega_r$ and/or antiresonant $\omega_a$ frequencies in accordance with Eq. 7, with the shunt elements' antiresonant frequencies (Oa approximately equal to the series elements' resonant frequencies $\omega_r$ and to then enable the circuit optimization tools to determine a modified set of resonant $\omega_r$ and antiresonant $\omega_a$ frequencies.

Ladder filters using surface acoustic wave resonators and especially resonators designed for relatively wide-band performance may be readily scaled in frequency by changing the pitch (periodicity) of the resonator transducer fingers (109, 109', FIG. 1) and reflection elements or fingers (116, 116') while maintaining the ratios of the resonant frequencies $\omega_r$ obtained from circuit analysis tools or other methods. This allows a designer to re-use a similar design at a slightly different center frequency fo having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

Figure 3:
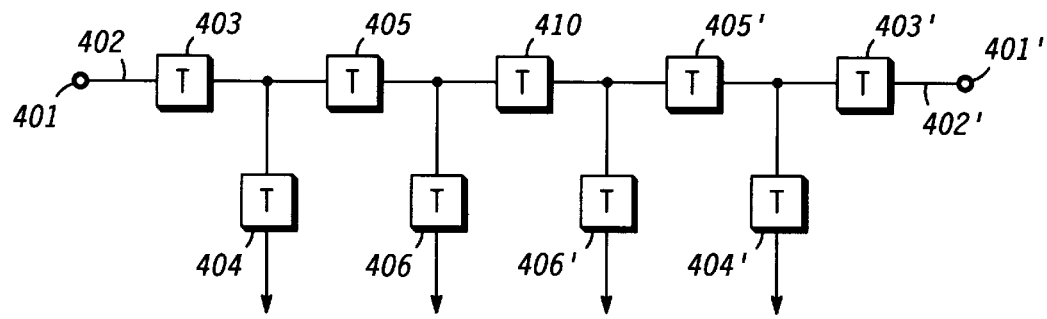
FIG. 3 is a simplified block diagram of a ladder filter.

FIG. 3 is a block diagram of ladder filter 400 in accordance with an exemplary embodiment of the instant invention. Ladder filter 400 includes electrical ports 401, 401' each coupled to transducer 403, 403', respectively, via interconnections 402, 402', respectively. Transducers 403, 403' each couple to shunt transducers 404, 404', respectively, and also each couple to series transducers 405, 405', respectively. Series transducers 405, 405' each couple to shunt transducers 406, 406', respectively, and also each couple to series transducer 410, coupling the two halves of filter 400 together. Transducers 403, 403', 404, 404', 405, 405', 406, 406', 410 each correspond to resonator 100, FIG. 1.

Figure 4:
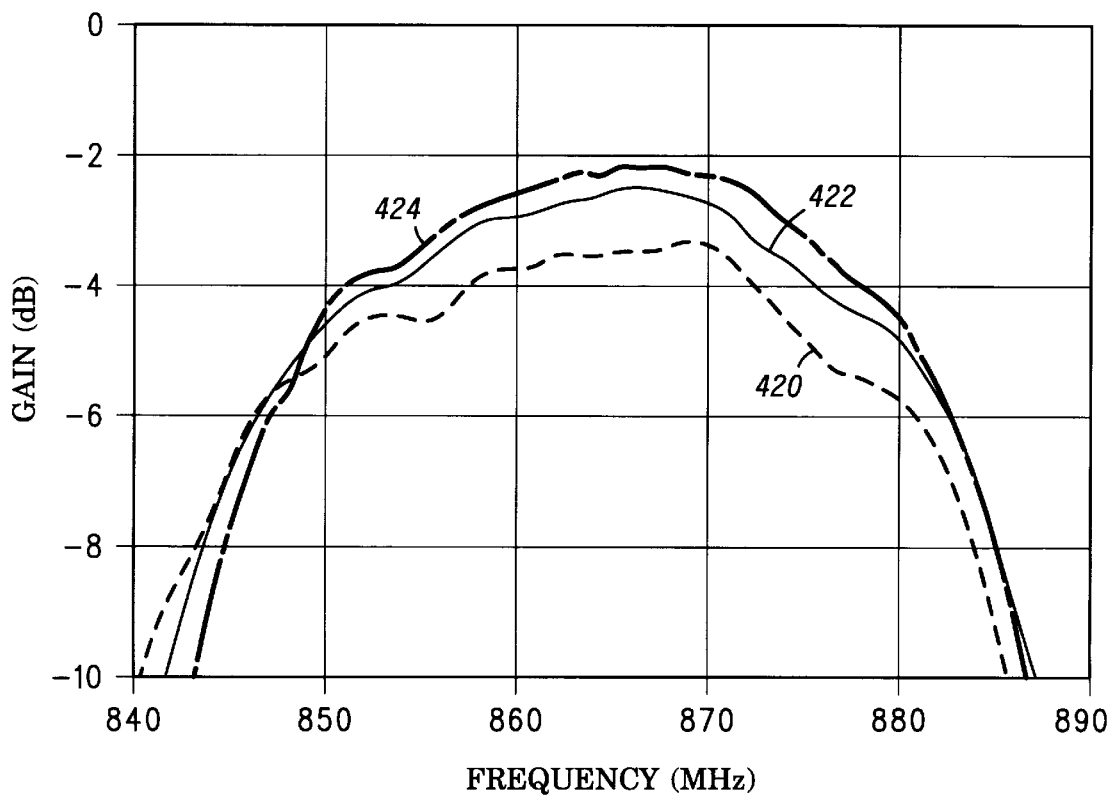
FIG. 4 is a graph depicting measured frequency responses for SAW ladder filters incorporating different sizes of grating and a response for a device having no gratings.

FIG. 4 provides (i) a graphical depiction of measured frequency responses for ladder filters similar to that of FIG. 3, where the filters incorporate different sizes of gratings 115, 115' and (ii) a graph of a response for a device having no gratings. These devices each used nine resonators, five as series resonators 403, 403', 405, 405', 410 and four as shunt resonators 404, 404', 406, 406'. Series resonators 403, 403', 405, 405', 410 incorporated 251 transducer electrodes and shunt transducers 404, 404', 406, 406' incorporated 301 electrodes. Gaps 112 (FIG. 1) between series resonator transducers 105 and reflectors 115, 115' were ⅝ of the wavelength of the series transducer reflectors in width while gaps 112 between shunt resonator transducers 105 and reflectors 115, 115' were 11/16 of a reflector wavelength wide. Isolated strips of one-third of gap width 112' were fabricated within gaps 112.

Trace 420 is a measured frequency response for a filter including no reflectors; trace 422 is a measured frequency response for a filter having ten reflection elements 116, 116' in each reflector 115, 115'; and trace 424 is a measured frequency response for a filter having twenty-five reflection elements 116, 116' in each reflector 115, 115'. Comparison of traces 420, 422, 424 shows that the first ten reflector elements 116, 116' provide the lion'share of the improvement in insertion loss, with the additional 15 elements in the device of trace 424 providing substantially less improvement in insertion loss. Experimentally measured passband width, high- and low-frequency band transition widths and number of reflectors are summarized below in Table I for the data of FIG. 4.

TABLE I

Bandwidths and number of reflection elements
(all bandwidths are given in megahertz)

| No. of Elements | Passband width | High side transition width | Low side transition width |
| --- | --- | --- | --- |
| None | 18.7 | 11.5 | 15.3 |
| 10 | 28.3 | 8.4 | 8.4 |
| 25 | 30.2 | 6.6 | 6.4 |

These filters were designed to meet a specification calling for less than 4.5 dB of insertion loss across a 19 MHz passband, increasing to >10 dB of rejection within <17.5 MHz on the high frequency side. The data of Table I show that the designs with optimized reflector structures have greater passband widths and narrower transition widths than the reflectorless design, giving them greater margins for meeting specifications.

Figure 5:
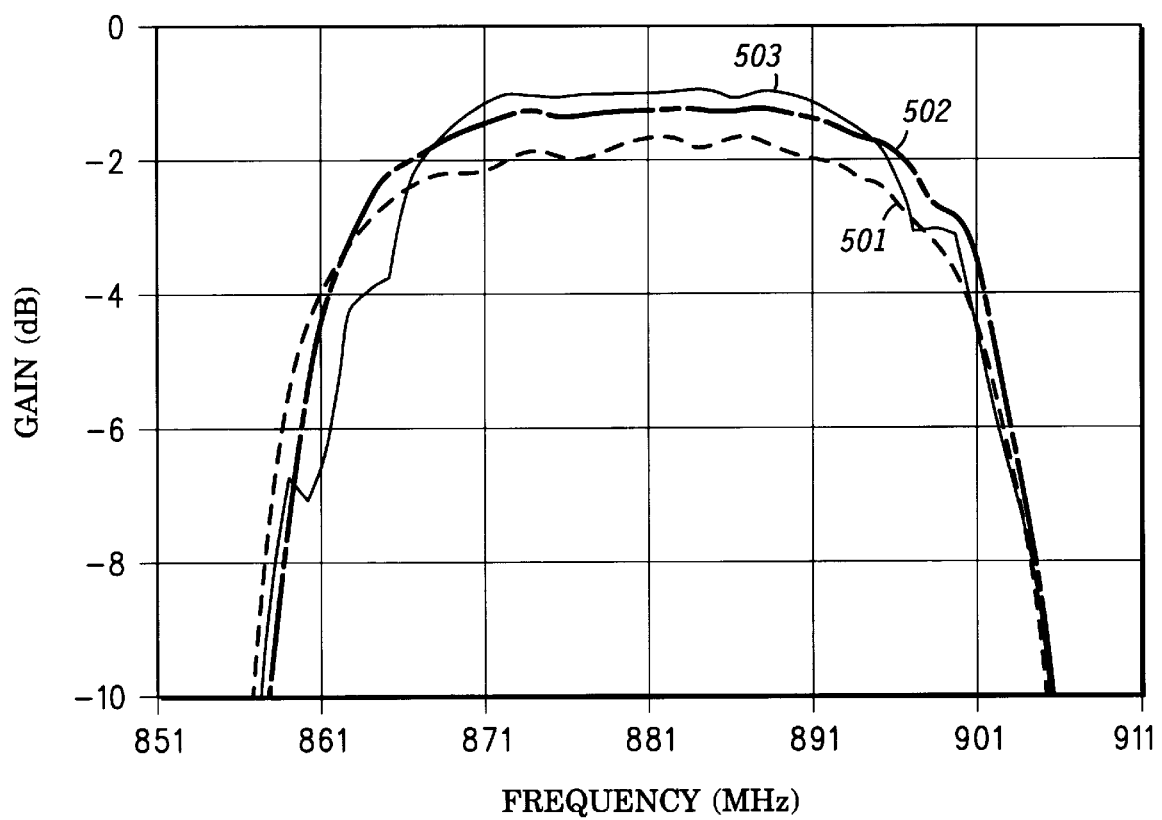
FIG. 5 is a graph of simulated frequency responses for ladder filters including differing numbers of reflection elements.

FIG. 5 is a graph of simulated frequency responses for ladder filters including differing numbers of reflection elements. Trace 501 is a simulation of a ladder filter response for a device having no reflectors; trace 502 corresponds to a device including 15 reflection elements 116, 116' (FIG. 1); and trace 503 corresponds to a device having 100 reflection elements 116, 116'. Again, the majority or lion'share of the insertion loss reduction occurs (traces 501, 502) for the first few reflection elements 116, 116', with relatively little improvement resulting from inclusion of the remainder (see trace 503). Also, the passband bandwidth and the transition band sharpness are both compromised in comparison to those of traces 501, 502. When transition bandwidth, passband insertion loss and passband bandwidth are all concerns, it is clear that an optimal number of reflection elements (e.g., 116, 116') may be chosen. For high coupling coefficient substrata, this may be determined as follows.

The bandwidth ($BW_L$) of a SAW ladder filter is related to the electromechanical coupling coefficient ($k^2$) of the substrate material as follows:

$$BW_L = (1+8k^2/\pi^2)^{0.5}+1, \tag{8}$$

while the bandwidth ($BW_R$) of a SAW reflective grating is given by:

$$BW_R = 2Ar(1+(\pi/N_g r)^2)/\pi, \tag{9}$$

where r represents the reflectivity of an individual reflective element 116, 116', $N_g$ represents the number of reflective elements 116, 116' in reflector 115, 115' and A represents the percentage of the reflector null bandwidth that is useful for the design. When A=1, $BW_R$ is the null bandwidth of the reflector. When A=⅓, $BW_R$ is approximately the 0.5 dB bandwidth of the reflector. When A=⅔, $BW_R$ is approximately the 4 dB bandwidth of the reflector. For high coupling coefficient substrata, r~$k^2/2$ and $BW_R$ may be expressed as:

$$BW_R = (Ak^2/\pi)(1+(2\pi/N_g k^2)^2)^{0.5}. \tag{10}$$

One method for optimizing a match between reflector 115, 115' and transducer 105 is to set the bandwidths of the two to be equal:

$$BW_R = BW_L \tag{11a}$$

or $$(Ak^2/\pi)(1+(2\pi/N_g k^2)^2)^{0.5} = (1+8k^2/\pi^2)^{0.5}-1 \tag{11}$$

Solving for $N_g$ yields $$Ng = (2\pi A)(2\pi^2+8k^2+2\pi(\pi^2+8k^2)^{0.5}-(Ak^2)^2)^{-2} \tag{12}$$

Useful reflector bandwidths are defined for ⅓≦A≦⅔, which defines the range for $N_g$ as:

$$(2\pi/3)(2\pi^2+8k^2+2\pi(\pi^2+8k^2)^{0.5}-(k^2/3)^2)^{0.5} \leq N_g \leq (4\pi/3)(2\pi^2+8k^2+2\pi(\pi^2+8k^2)^{0.5}-(2k^2/3)^2)^{-0.5}. \tag{13}$$

Table II below gives typical ranges for $N_g$ computed from the above inequality for several high coupling coefficient substrata and orientations.

TABLE II

Ranges for optimal numbers of reflection elements for several different substrata and orientations.

| Material | $k^2$ | Lower limit | Upper limit |
|---|---|---|---|
| 36° $LiTaO_3$ | 7.5% | 23 | 53 |
| 64° $LiNbO_3$ | 11.5% | 15 | 35 |
| 41° $LiNbO_3$ | 18% | 9 | 23 |

Generally, in accordance with the present invention, the number $N_g$ of reflection elements 116, 116' (FIG. 1) is usefully in a range of from five to seventy five, preferably in a range of from seven to seventy and desirably in a range of from nine to about fifty five.

Figure 6:
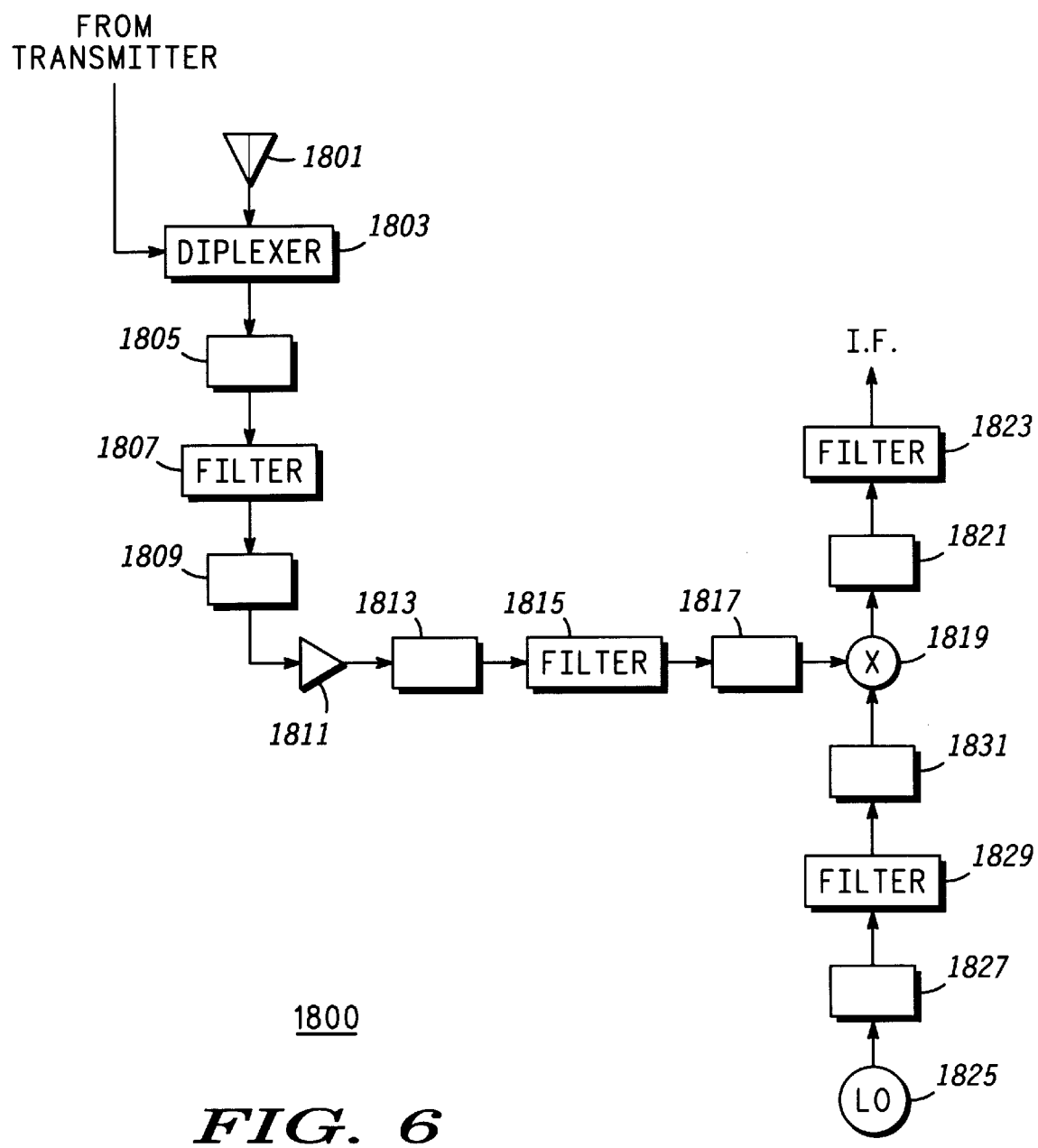
FIG. 6 is a block diagram of a portion of a radio frequency apparatus including ladder filters in accordance with the present invention.

FIG. 6 is a block diagram of portion 1800 of a radio frequency receiver or other radio frequency apparatus including ladder filters in accordance with the present invention. Apparatus 1800 includes antenna 1801, by way of example, used to receive and/or transmit signals. Alternatively, antenna 1801 could be replaced by a fiber-optic link or cable or other signal transmissive media.

Diplexer 1803 is coupled to antenna 1801 and to a transmitter portion (not shown). Diplexer 1803 is a special purpose filter which couples received signals (but not much larger signals from an attached transmitter) to filter 1807 via optional matching circuit 1805 according to the present invention. Filter 1807 is coupled to amplifier 1811 via optional matching element 1809. The output of amplifier 1811 is transmitted to filter 1815 via optional matching element 1813. Filter 1815 transmits its output to mixer 1819 via optional matching element 1817. The signal from filter 1815 is combined in mixer 1819 with another signal from local oscillator 1825 coupled via filter 1829. Matching elements 1827, 1831 and 1821 are optionally provided with filters 1823, 1829. The output signal from mixer 1819 is then filtered by filter 1823 to provide the IF output signal. The arrangement of the present invention may be used to provide any or all of filters 1803, 1807, 1815, 1823, 1829. An oscillator and filter analogous to LO 1825, filter 1829 may be employed together with a suitable amplifier and modulator to provide the signal "FROM TRANSMITTER" and this filter (known as a "transmit clean-up filter") as well may be provided in accordance with the present invention. Thus, a ladder filter has been described which overcomes specific problems and accomplishes certain advantages relative to prior art methods and mechanisms. The improvements over known technology are significant. The expense, complexities, and high parts count of prior art cascaded filters are avoided. Further, real input and output impedances are realized for compact, lightweight, adjustment-free filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of making an acoustic wave device, said method comprising steps of:

provoking a substrate for supporting acoustic wave propagation;

disposing a first transducer on said substrate, said first transducer for converting electrical energy to acoustic energy and vice versa; and disposing a first reflector at a first acoustic port of said first transducer, wherein said first reflector includes a first number of reflection elements, wherein said first number includes a first number $N_g$ of reflection elements, said first number $N_g$ chosen in accordance with $(2\pi/3)(2\pi^2+8k^2-2\pi(\pi^2+8k^2)^{-0.5}(k^2/3)^2)^{-0.5} \leq N_g \leq (4\pi/3)(2\pi^2+8k^2-2\pi(\pi^2+8k^2)^{-0.5}(2k^2/3)^2)^{-0.5}$, wherein $k^2$ is an electromechanical coupling coefficient of said substrate.

2. A method as claimed in claim 1, further comprising a step of disposing a second reflector at a second acoustic port of said first transducer, wherein said second reflector includes said first number of reflection elements.

3. A method as claimed in claim 1, further comprising a step of disposing a second reflector at a second acoustic port of said first transducer, wherein said second reflector includes a second number of reflection elements, said second number chosen from a group consisting of numbers between seven and seventy inclusive, wherein said second number includes a second number $N_{g2}$ of reflection elements, said second number $N_{g2}$ chosen in accordance with $(2\pi/3)(2\pi^2+8k^2-2\pi(\pi^2+8k^2)^{-0.5}(k^2/3)^2)^{-0.5} \leq N_{g2} \leq (4\pi/3)(2\pi^2+8k^2-2\pi(\pi^2+8k^2)^{-0.5}(2k^2/3)^2)^{-0.5}$.

4. An acoustic wave device manufactured by the method of claim 1.

* * * * *